United States Patent
Heubi et al.

(10) Patent No.: US 6,940,343 B2
(45) Date of Patent: Sep. 6, 2005

(54) AMPLIFIER

(75) Inventors: Alexandre Heubi, La Chaux-de-Fonds (CH); Christian Caduff, Bern (CH)

(73) Assignee: AMI Semiconductor, Inc., Pocatello, ID (US)

( * ) Notice: Subject to any disclaimer, the term of this patent is extended or adjusted under 35 U.S.C. 154(b) by 52 days.

(21) Appl. No.: 10/640,922

(22) Filed: Aug. 14, 2003

(65) Prior Publication Data

US 2004/0124915 A1 Jul. 1, 2004

Related U.S. Application Data

(60) Provisional application No. 60/403,288, filed on Aug. 14, 2002, and provisional application No. 60/403,286, filed on Aug. 14, 2002.

(51) Int. Cl.$^7$ ............................................... H03F 3/38
(52) U.S. Cl. ...................... 330/10; 330/207 A

(58) Field of Search .................. 330/10, 207 A, 330/251

(56) References Cited

U.S. PATENT DOCUMENTS

| | | | | |
|---|---|---|---|---|
| 5,479,337 A | * | 12/1995 | Voigt | 363/131 |
| 6,373,336 B1 | * | 4/2002 | Anderskouv et al. | 330/10 |
| 6,734,725 B2 | * | 5/2004 | Masuda et al. | 330/10 |

* cited by examiner

*Primary Examiner*—Patricia Nguyen
(74) *Attorney, Agent, or Firm*—Gardner Groff, P.C.

(57) ABSTRACT

Disclosed is an Amplifier (7) comprising an output driver with a first output stage (4) and a second output stage (5), where an input signal is applied non-inverted to the first output stage and inverted to the second output stage, characterized in that said input signal is applied with delay to one of the output stages (4, 5).

5 Claims, 5 Drawing Sheets

AMPLIFIER

This application claims priority to U.S. provisional application Ser. No. 60/403,288 filed Aug. 14, 2002 and U.S. provisional application Ser. No. 60/403,286, filed Aug. 14, 2002, entitled "TRI-STATE OUTPUT STAGE", which is incorporated by reference herein in its entirety.

FIELD OF THE INVENTION

The present invention relates to an amplifier comprising an output driver with a first output stage and a second output stage, where an input signal is applied non-inverted to the first output stage and inverted to the second output stage.

BACKGROUND OF THE INVENTION

In an amplifier comprising an output driver with a first output stage and a second output stage, where an input signal is applied non-inverted to the first output stage and inverted to the second output stage, usually denominated as a class-D amplifier/driver, an input signal (typically an audio-signal) is transformed into an output signal capable of being reproduced into the original signal on an external load, usually a speaker or the like. In the basic operation of a class-D amplifier/driver, an incoming signal is converted e.g. by a pulse-width or pulse-code modulator or the like into a high-frequency rectangular wave, the average value of which tracks the original signal. The rectangular wave is fed into an output stage which provides level shifting and splits the signal into a high/low driving signal. The driving signal is filtered to remove the switching noise, providing an averaged output to drive a load such as a speaker.

The output of a differential class-D amplifier/driver oscillates between two extremes to represent an analog signal. These two extremes are built by having 1–0 or 0–1 at the output. For example an amplifier powered by a 5V voltage has at one extreme a first output pin at a voltage of 5V and a second at a voltage of 0V. On the other extreme, the first output pin is at a voltage of 0V and the second at a voltage of 5V.

A resistive or capacitive load applied to the amplifier always has a voltage of ±5V at its boundaries and thus enables the load to draw a lot of current.

OBJECTS OF THE INVENTION

It is a first object of this invention to provide a differential class-D amplifier/driver with a reduced power consumption in case of a load applied to the amplifier.

It is another object of this invention to provide a class-D amplifier/driver with an improved output signal quality.

SUMMARY OF THE INVENTION

The foregoing objects and advantages are realized by an amplifier and the use of an amplifier according to the independent claims. Further advantageous features and embodiments are defined in the dependent claims.

In particular, the object of the present invention is achieved by an amplifier comprising an output driver with a first output stage and a second output stage, where an input signal is applied non-inverted to the first output stage and inverted to the second output stage, where said input signal is applied with delay to one of the output stages. An amplifier according to the present invention is used for driving a load, for example a speaker, an earphone or the like. Input to the amplifier is a digital or analog signal. The amplifier may comprise different stages, for example a pre-amplifier and a final stage. The final stage comprises an output driver with a first output stage and a second output stage. The input signal is applied non-inverted to one of the output stages, for example the first output stage, and inverted to the other output stage, for example the second output stage. Thus, the output signals of the output stages are inverted to each other. The input signal of one of the output stages is applied with delay to this stage. In effect, the output signals of the output stages are sometimes opposing of each other and have the same polarity during the time of delay. If the output signals of the output stages have the same polarity, there is no current drawn by the load. Thus, the power consumption of the amplifier and the load is reduced. As a second effect, the quality of the output signal is improved by putting a delay in one of the output paths.

Preferably, the input signal for the output stages is a signal with a first and a second known level, i.e. a positive biased input voltage and a negative biased input voltage. The output signal of the first and the second output stage is preferably a signal with a first and second known level, which are a positive biased voltage and a negative biased voltage. The output signal of a first and second output stage is directly applied to a load.

In one embodiment according to the present invention, said amplifier further comprises a digital/analog converter, where the output signal of the digital/analog converter is applied as input signal non-inverted to the first output stage and inverted to the second output stage. Preferably, the digital/analog converter is a Sigma-Delta modulator with a single-bit signal at its output, which is directly input to the output stages. The single bit signal of the digital analog converter is applied over one path to the first output stage and over another path to the second output stage. In one of the paths an inverter is provided. Additionally, in one of the paths a delay element is provided. Inverter and delay element may be placed in the same signal path or in different signal paths.

In a preferred embodiment of the amplifier, the delay equals 1/(oversampled frequency). Oversampled frequency is the working frequency of the Sigma-Delta modulator. If the delay equals 1/(oversampled frequency), most of the time the load doesn't pull any current and no power is consumed. If the delay equals 0, the load always pulls current and the behaviour of the amplifier according to the present invention is like the behaviour of a state of the art amplifier.

The amplifier according to the present invention may be used for reducing the total harmonic distortion and noise of a class-D amplifier/driver. The amplifier according to the present invention may also be used for reducing the power consumption of a class-D amplifier/driver.

SHORT DESCRIPTION OF THE DRAWINGS

A preferred embodiment of the present invention will be described below with reference to the accompanying drawings, in which.

DETAILED DESCRIPTION OF THE PREFERRED EMBODIMENTS

The present invention consists of adding a third level to the output of the class-D amplifier, and converting it to a tri-state output system. In addition to the two known levels, positive biased voltage and negative biased voltage, a third level is added. At the third level, both pins of a load are set to the same biased voltage, so that no voltage is applied to the output load. So while the amplifier is in the third state, the load pulls no current and, thus, no power is consumed.

Figure 1:
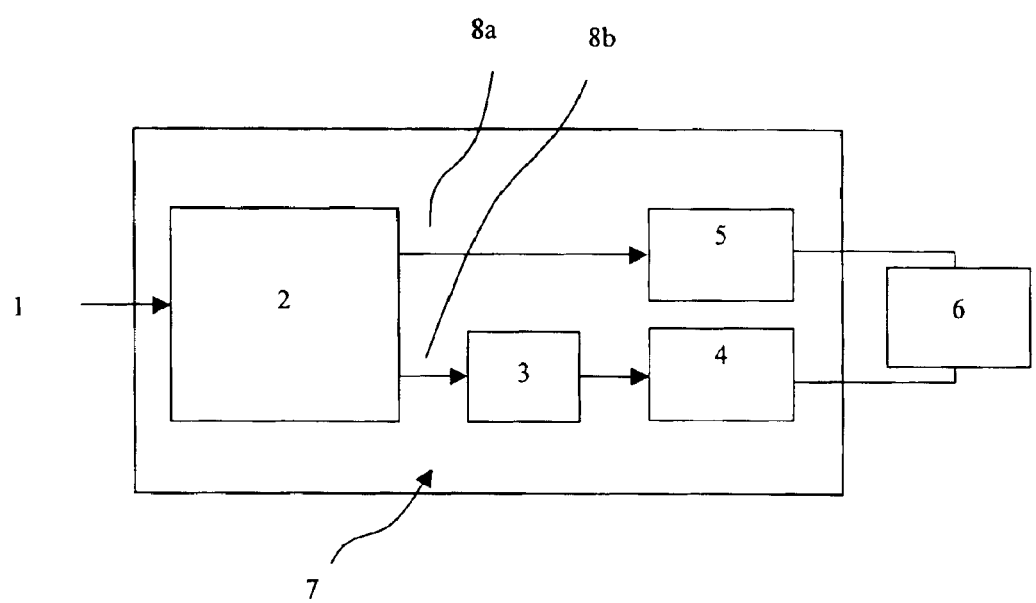
FIG. 1 is a block diagram of a class-D amplifier/driver with delay.

FIG. 1 is a block diagram of a class-D amplifier/driver with delay in accordance with principles of the present invention. An analog or digital signal 1 is input for a signal treatment device 2. Output signals of said signal treatment device 2 are an inverted signal 8a and a non-inverted signal 8b. The polarity of the signals 8a, 8b are opposing each other. The signal 8 is input signal for output stages 4, 5. One of the signals, the inverted signal 8a or the non-inverted signal 8b, is applied to a delay element 3. In the embodiment shown in FIG. 1, the non-inverted signal 8b is applied to a delay element 3. Alternatively, the inverted signal 8a could be applied to the delay element 3. In effect, one of the signals 8a, 8b, the inverted or the non-inverted, of said signal treatment device 2 is applied with delay to the first output stage 4, the other one is applied without delay to the second output stage 5. Output pins of said first and second output stages 4, 5 are connected to a load 6. Said load 6 usually is a loudspeaker, earphone or the like, therefore a resistive, capacitive or inductive load.

Instead of always having the exact opposite of the first output stage 4 on the second output stage 5, the signal for the first output stage 4 is delayed. Therefore, the two output pins often have the same voltage and no voltage drop is applied to the load 6. If the delay is small, the quality of the output signal stays the same as for the normal class-D structure.

Figure 2:
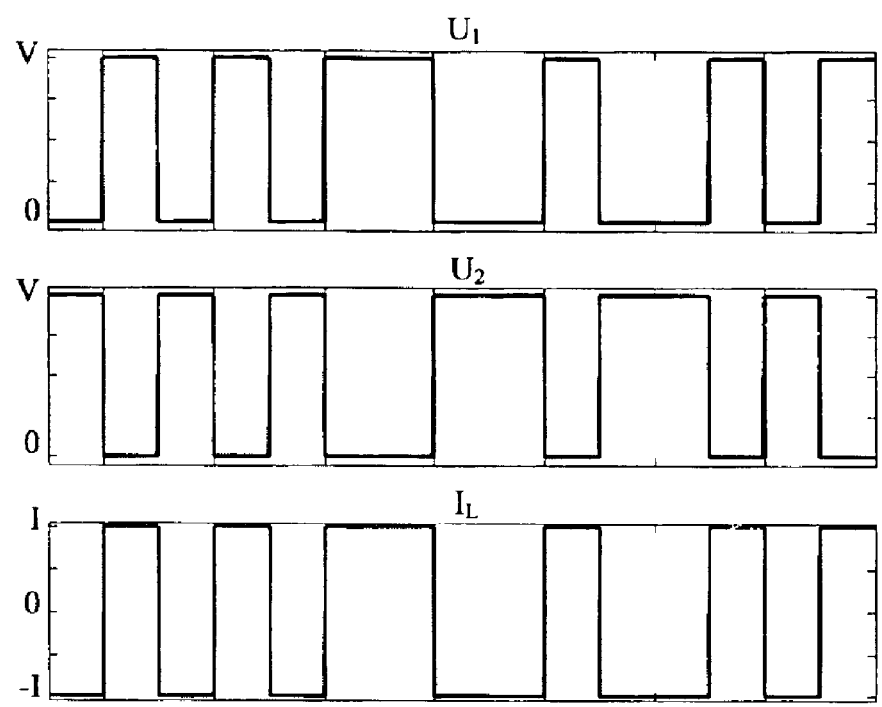
FIG. 2 illustrates the output level of the two pins of a state of the art differential class-D amplifier and the current through a resistive load applied to the amplifier.

FIG. 2 shows the outputs $U_1$ and $U_2$ of a standard class-D amplifier having the second output always at the opposite of the first output. The voltages $U_1$ and $U_2$ each correspond to one of the output pins of first and second output stage 4, 5. Current $I_L$ through a resistive load is always at a maximum value ($\pm I$).

Figure 3:
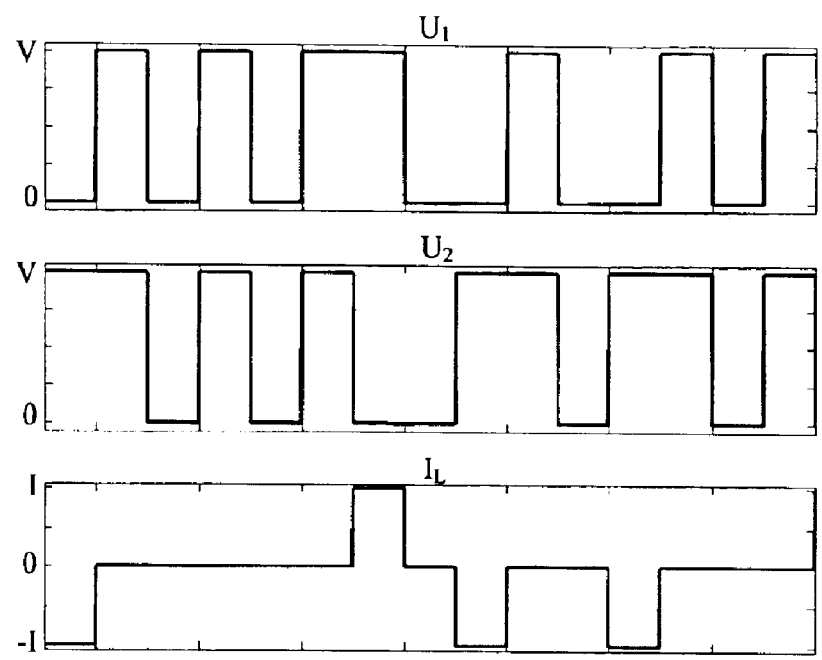
FIG. 3 illustrates the output level of the two pins of a differential class-D amplifier with delay and the current through a resistive load applied to the amplifier.

FIG. 3 illustrates the output $I_L$ of a differential class-D amplifier with delay. The voltages $U_1$ and $U_2$ are not only alternating but also phase delayed. As shown in FIG. 3, there is no current $I_L$ through the load most of the time in the amplifier with delay according to the present invention.

In case the input is a constant at half the input voltage range, the output of the standard amplifier oscillates "clock-like". By putting the delay time in the amplifier according to the present invention equal to the oscillation frequency, the power consumption goes to zero. In contrast to this, if the input stays at its maximum or minimum value, there is no reduction in power consumption.

So for the amplifier according to the present invention, the power consumption depends about linear from the input signal amplitude, whereas for the standard amplifier the power consumption stays always at its maximum value.

According to the present invention, the power consumption of any class-D amplifier can be reduced. The reduction is even more important for class-D output drivers because they often have a load with a low resistivity.

Figure 4:
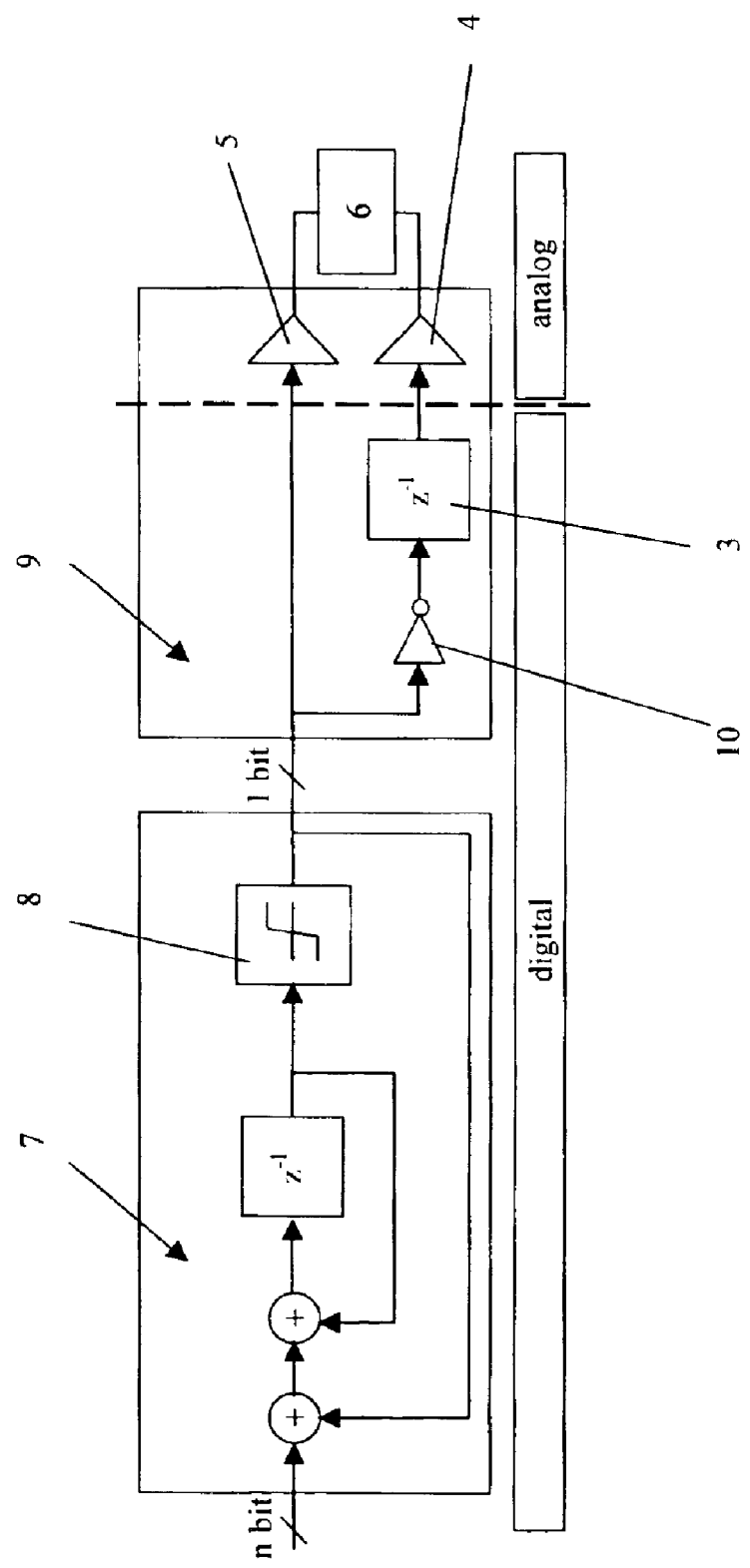
FIG. 4 depicts a tri-state output driver driven by a Sigma-Delta modulator.

The tri-state output stage in accordance with the invention is also very advantageous for output drivers directly driven by a Sigma-Delta modulator. As shown in FIG. 4., the Sigma-Delta modulator 7 converts a high-resolution low frequency signal by a single-bit quantizer 8 into a low-resolution high frequency signal. For example, a 16-bit signal sampled at 16 kHz is converted into a single-bit 2 MHz signal. By applying this 2 MHz signal to a driver 9 comprising a second output stage 5 as a first path and an inverter 10, delay element 3 and first output stage 4 as a second path, a class-D style differential output driver can be accomplished. Said driver 9 corresponds to the amplifier/driver as illustrated in FIG. 1.

Again, by putting a delay before one of the output stages 4,5, the power consumption is heavily reduced because most of the time there is no differential voltage applied to the load of the output stages.

Measurements with a third-order Sigma-Delta modulator show that with a full-scale sinusoidal input signal (0 dB) at the modulator and with a delay equal to 1/(oversampled frequency) the current through the load is reduced by 17% compared to the standard structure without delay. With an input signal amplitude of −20 dB and below, the reduction in power consumption is over 70%.

Figure 5:
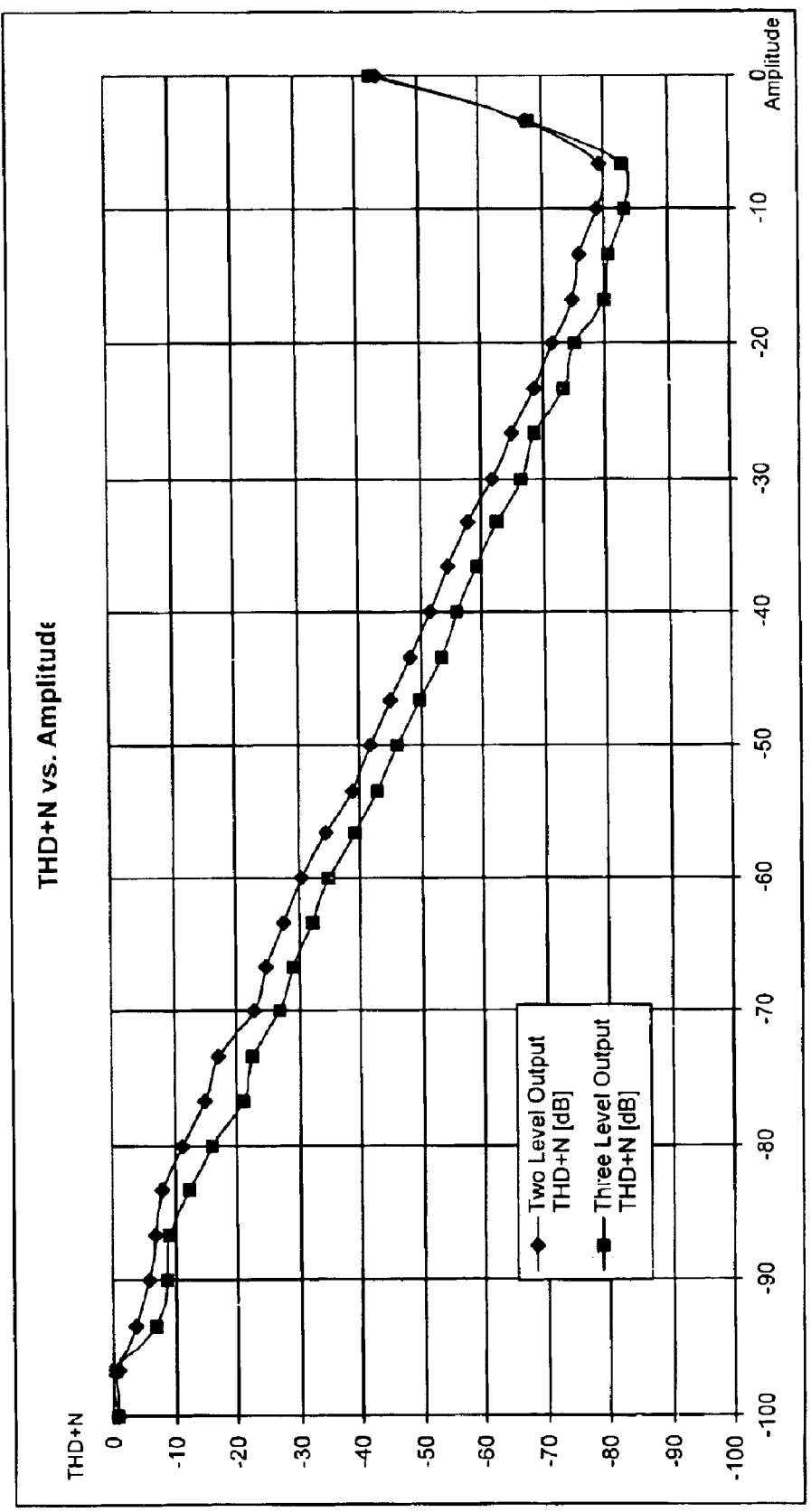
FIG. 5 is a diagram showing total harmonic distortion and noise versus amplitude of a class-D amplifier by using a state of the art output driver and by using an output driver according to the invention.

An additional advantage of this invention is the increased quality of the output signal. By adding the delay an improvement of several dB's of total harmonic distortion plus noise (THD+N) and signal to noise ratio (SNR) could be measured. FIG. 5 depicts a diagram showing total harmonic distortion and noise (THD+N) versus amplitude measurement on the output of an audio 16-bit Sigma-Delta Digital/Analog converter. A Line marked, "two level output" shows the measurement of a state of the art amplifier as output driver, a line marked, "three level output" shows the measurement of an amplifier according to the present invention as output driver. As shown in FIG. 5, THD+N of an output driver according to the present invention is lower than THD+N of a state of the art output driver over nearly the whole volume range between −98 dB and 0 dB. Only at very small and at very high amplitudes, near −98 dB and 0 dB, THD+N is about the same for a state of the art and an output driver according to the present invention.

While the present invention has been described with reference to specific embodiments, the description of the invention is merely illustrative and is not to be construed as limiting the invention. Various modifications and variations may occur to those skilled in the art without departing from the true spirit and scope of the invention as defined in the appended claims.

What is claimed is:

1. Amplifier comprising:
  a Sigma-Delta modulator for receiving an input signal and outputting two output signals including a non-inverted signal and an inverted signal, the input signal having a first voltage level and a second voltage level;
  a delay element for delaying one of the two output signals, a delay of the delay element being substantially equal to 1/(oversampled frequency), the oversampled frequency being the working frequency of the Sigma-Delta modulator; and
  an output driver including a first output stage and a second output stage, the first output stage for receiving the delayed signal from the delay element, the second output stage for receiving the non-delayed signal among the two output signals.

2. Amplifier according to claim 1 wherein the first voltage level and the second voltage level are associated with a positive biased input voltage and a negative biased input voltage.

3. Amplifier according to claim 1 wherein the first output of the first output stage and the second output of the second output stage have a positive biased voltage and a negative biased voltage, and wherein the differential signal of the first output and the second output is approximately zero level most of the operation.

4. Amplifier according to claim 1 wherein the Sigma-Delta modulator includes a digital/analog converter (DAC).

5. Amplifier according to claim 1, wherein a first output of the first output stage and a second output of the second output stage are applied to a load.

* * * * *